(12) United States Patent
Alelyunas et al.

(10) Patent No.: US 6,560,293 B1
(45) Date of Patent: May 6, 2003

(54) APPARATUS AND METHOD FOR FM REMODULATION OF ENVELOPE MODULATED DATA SIGNALS

(75) Inventors: Carl H. Alelyunas, Nevada City, CA (US); Cotter W. Sayre, Nevada City, CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/304,756

(22) Filed: May 4, 1999

(51) Int. Cl.[7] .............................. H04L 5/12; H04L 23/02
(52) U.S. Cl. ...................... 375/261; 375/270; 375/301; 455/109
(58) Field of Search ................................. 375/261, 270, 375/277, 301, 300, 268; 455/109, 108

(56) References Cited

U.S. PATENT DOCUMENTS 4,194,154 A * 3/1980 Kahn ........................ 455/114
4,622,694 A * 11/1986 Weber et al. ................. 455/47
4,660,193 A * 4/1987 Young et al. ............... 370/204

OTHER PUBLICATIONS

Bellamy, John, *Digital Telephony, Second Edition*, Wiley Series in Telecommunications, 1990, pp. 279–332.
"Cable Modem Telephony Return Interface Specification (Interim) SP–CMTRI–101–970804", Multimedia Cable Network Systems (MCNS) Holdings, L.P., 1997, pp. 1 to 74.
"Radio Frequency Interface Specification (Interim) SP–RFII–102–971008", Multimedia Cable Network Systems (MCNS) Holdings, L.P., 1997, pp. 1 to 135.

* cited by examiner

Primary Examiner—Mohammad H. Ghayour
(74) Attorney, Agent, or Firm—McDonnell Boehnen Hulbert & Berghoff

(57) ABSTRACT

An apparatus and method for transmitting envelope modulated data signals on a Radio Frequency (RF) carrier system, which produces high error performance through remodulation of the data signals onto an RF carrier are provided. The apparatus includes a transmit chain where, the data signal is input to a mixer to create upper and lower sidebands of the data signal. A low pass filter removes the upper sideband and passes the lower sideband to a frequency modulation (FM) modulator which modulates an RF carrier with the lower sideband. The apparatus also includes a receiver chain that has an FM receiver which receives the FM RF carrier signal transmitted by the transmit chain and recovers the lower sideband, which is then input to a multiplier to again generate upper and lower sideband signals. A bandpass filter removes the lower sideband and passes the upper sideband as a received envelope modulated data signal.

25 Claims, 12 Drawing Sheets

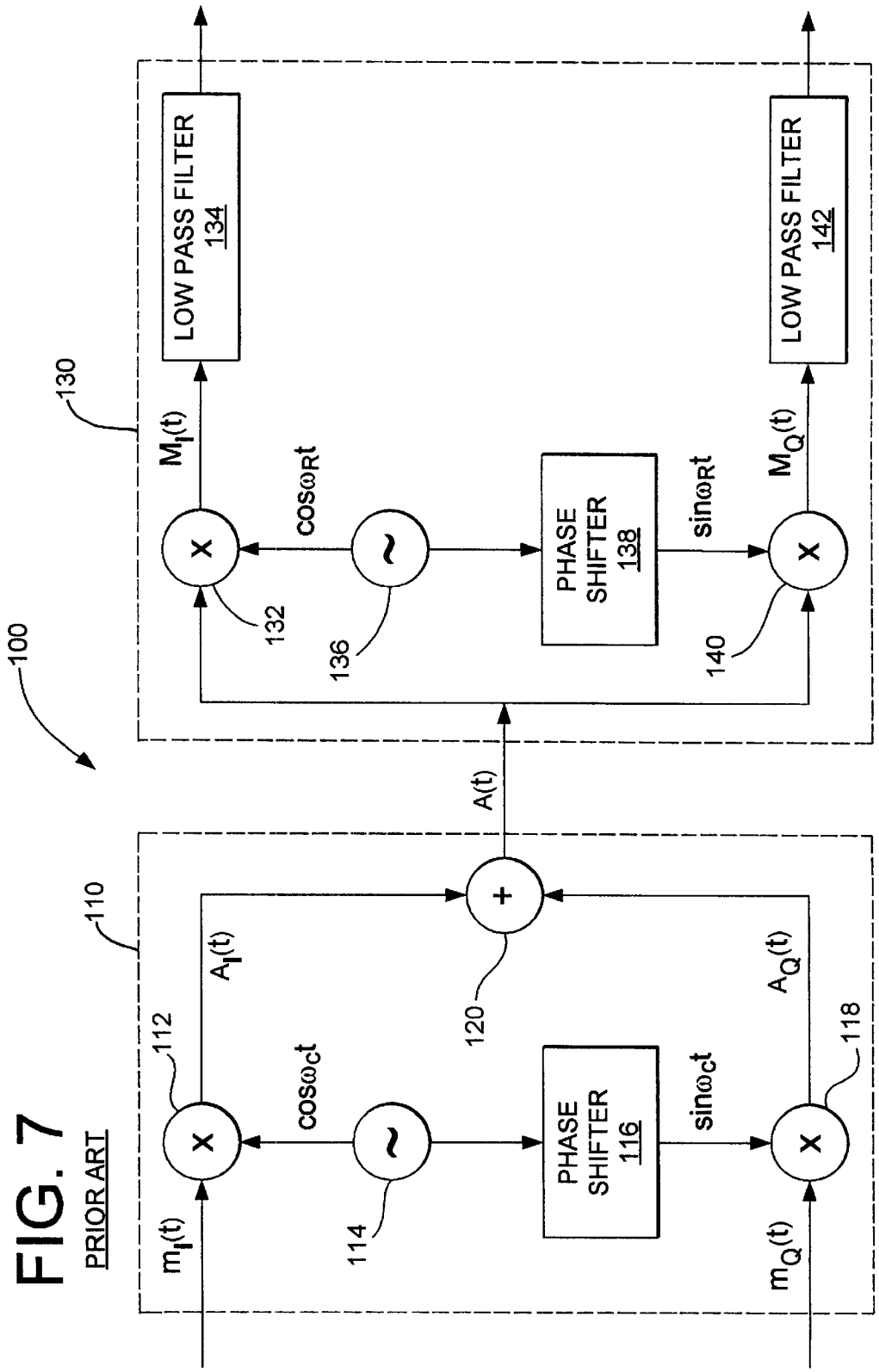

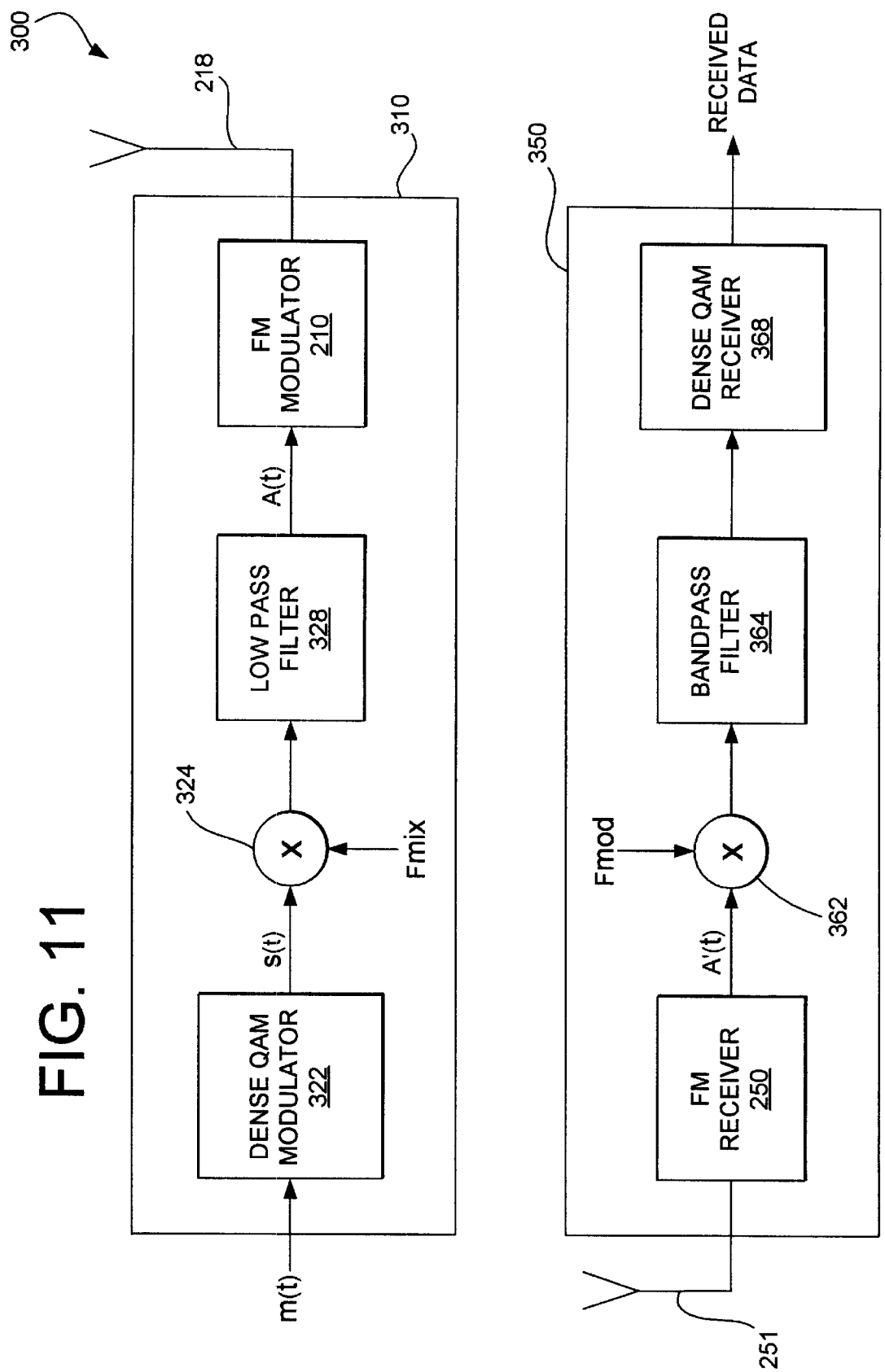

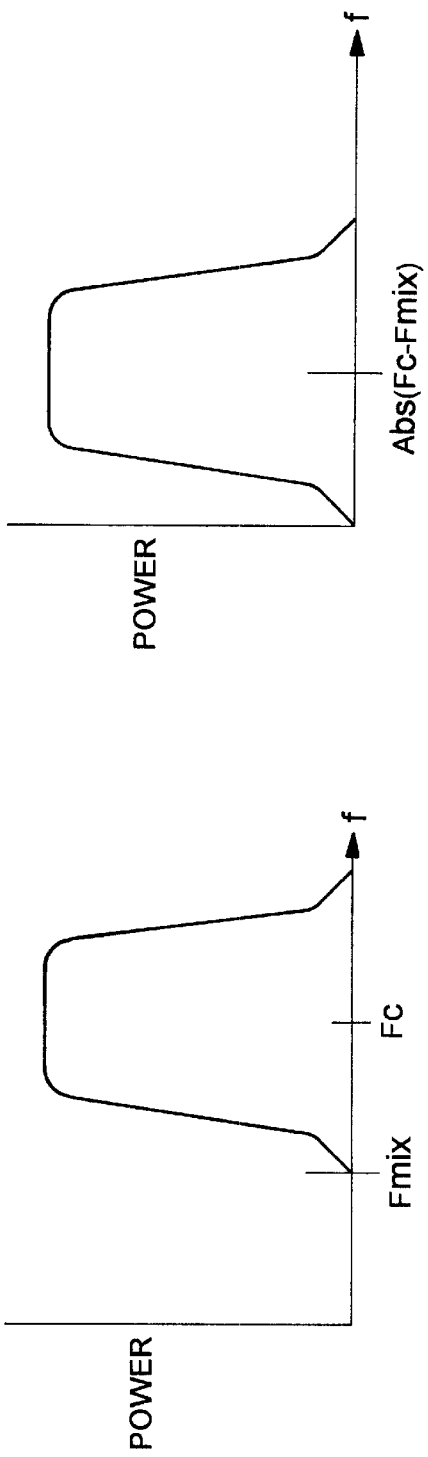
FIG. 12A
FIG. 12B
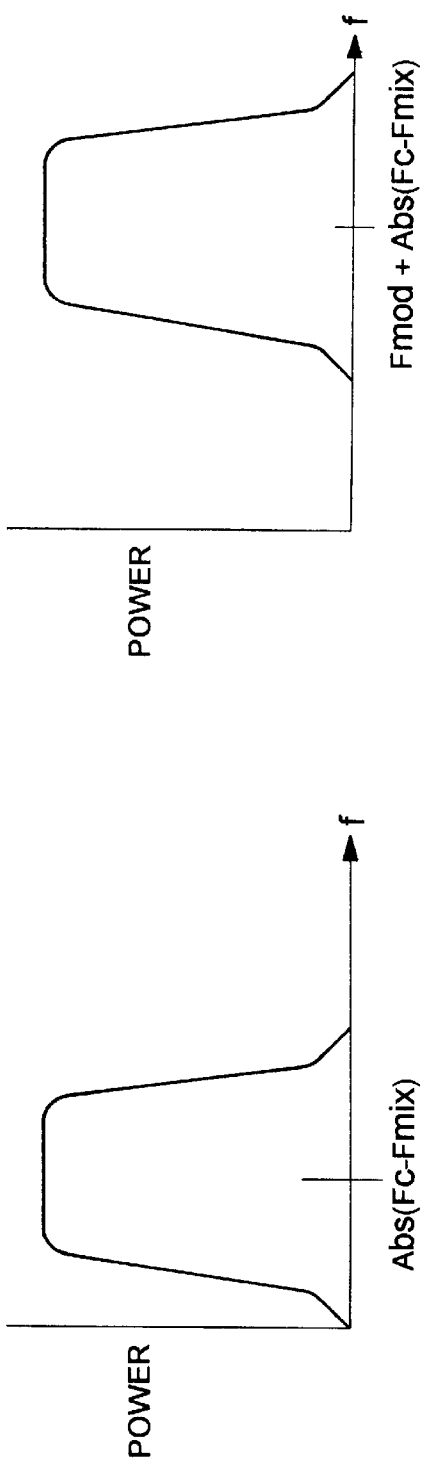
FIG. 12C
FIG. 12D

APPARATUS AND METHOD FOR FM REMODULATION OF ENVELOPE MODULATED DATA SIGNALS

FIELD OF INVENTION

The present invention relates to communications systems. More specifically, it relates to the reliable transmission of envelope modulated data signals.

BACKGROUND OF THE INVENTION

In order to transmit digital data from one device to another, as in a network or over a modem, it is generally necessary to encode digital data on a carrier signal. One approach to encoding digital data is to encode the data by modulating the amplitude of the carrier signal. In other words, the digital data is encoded in the envelope of the carrier signal.

Another approach is to encode the data by varying the frequency of the carrier signal. An example of a frequency based encoding scheme is Frequency Shift Keying (FSK), where the digital data is encoded in small changes in the frequency of the carrier signal. Yet another approach is to encode the data by varying the phase of the carrier signal. An example of phase based encoding is Phase Shift Keying (PSK), where the digital data is encoded by changing the phase of the carrier signal. Frequency and phase based encoded signals typically have a constant envelope, i.e. no information is encoded in the envelope of the encoded signal, though some envelope modulation is introduced to phase encoded signals due to the change in amplitude that occurs in shifting from one phase angle to another.

In order to obtain high data transmission rates, it is desirable to encode digital data using high density encoding schemes. The idea behind high density encoding of digital data is to encode multiple bits of information in each signal cycle of the analog carrier. Some of the highest known density encoding schemes, such as Quadrature Amplitude Modulation (QAM), utilize amplitude modulation of the carrier frequency, along with phase and frequency modulation, in order to obtain high data densities. Consequently, such high density signals do not have a constant envelope.

It is also often desirable to broadcast and receive digital data at high data rates over long distances. A common method for transmitting digital data is to impress the digital data onto an analog Radio Frequency (RF) carrier for broadcast on a radio system. Typically, a digital data signal is used to modulate the carrier frequency or frequencies in some manner to produce a RF signal containing the data.

The digital data signal used to modulate the RF carrier is typically a signal derived from encoding the binary logic values of a digital stream into either one or two signals having a number of discrete levels, each level representing a digital state (i.e. one or more data bits). One example of a digital data signal is Non-Return to Zero (NRZ).

To obtain higher data transmission rates on an RF transmission system, it is desirable to impose a high density data signal onto the RF carrier frequency. However, as noted above, high density data signals often have non-constant envelopes that encode information. The transmission of a non-constant envelope signal using a RF system presents some significant difficulties.

One difficulty with signals with information encoded in the envelope is that anything that affects the envelope of the RF transmission signal will introduce distortion to the data signal and degrade the error performance of the communication system. Consequently, non-constant envelope signals are unsuitable for use in systems that use saturating amplifiers. Also, high density signals require extremely linear amplifier performance in order to accommodate the wide range of signal amplitudes.

Furthermore, in certain cases, RF systems have a limit on the peak envelope power of the transmitter. This can be due to many causes, such as the unavailability of cost-effective linear amplification devices or regulatory constraints. Also, spectral shaping, or filtering, is often performed in an RF system prior to up-conversion and non-linear amplification in order to limit the bandwidth of the RF channel. The input signal must have a relatively constant envelope to prevent regrowth of spectral sidelobes in the RF signal during non-linear amplification.

Therefore, the need exists for a cost-effective system for transmitting high density data signals over long distances and with good error performance.

SUMMARY OF THE INVENTION

In accordance with preferred embodiments of the present invention, some of the problems associated with high density data transmission are overcome.

One aspect of the invention includes a data transmission system composed of an envelope modulating data encoder configured to receive a binary data stream at an input terminal and, responsive thereto, generate an envelope modulated data signal at an output terminal. The system also includes a mixer having a first input terminal coupled to the output terminal of the envelope modulating data encoder and a second input terminal configured to receive a mixing frequency. The mixer is configured to mix the envelope modulated data signal and the mixing frequency in order to generate upper and lower sideband transmit data signals at an output terminal of the mixer. A lowpass filter of the system has an input terminal coupled to the output terminal of the mixer and is configured to pass the lower sideband transmit data signal generated by the mixer to an output terminal of the lowpass filter. An input terminal of a frequency modulator is coupled to the output terminal of the lowpass filter and the frequency modulator is configured to frequency modulate a radio frequency carrier responsive to the lower sideband transmit data signal in order to generate a frequency modulated data signal.

Another aspect of the present invention is a data receiver system that includes a frequency modulation receiver having an input terminal configured to receive a frequency modulated data signal modulated by an envelope modulated data signal. The frequency modulation receiver is configured to demodulate the frequency modulated data signal in order to recover the envelope modulated data signal for output at an output terminal of the frequency modulation receiver. The receiver also includes a multiplier having a first input terminal coupled to the output terminal of the frequency modulation receiver and a second input terminal configured to receive a decoder data modulation frequency. The multiplier is configured to multiply the decoder data modulation frequency and the envelope modulated data signal in order to generate upper and lower receiver sideband data signals at an output terminal of the multiplier. An input terminal of a bandpass filter is coupled to the output terminal of the multiplier and the bandpass filter is configured to pass the upper receiver sideband data signal to an output terminal of the bandpass filter. An input terminal of an envelope modulated data decoder is coupled to the output terminal of the bandpass filter. The decoder is configured to demodulate data centered on the decoder data modulation frequency so that the decoder demodulates the upper receiver sideband data signal in order to obtain a binary data stream corresponding to the envelope modulated data signal for output at an output terminal of the decoder.

An embodiment of a method for transmitting an envelope modulated data signal, according to the present invention, involves mixing the envelope modulated data signal with a mixing frequency to produce upper and lower sideband transmit data signals and selecting the lower sideband transmit data signal as a transmit data modulating frequency. The method then calls for modulating an RF carrier signal with the transmit data modulating frequency in order to generate a RF data signal.

A further embodiment of the method, according to the present invention, for transmitting an envelope modulated data signal includes receiving and demodulating the frequency modulated data signal to obtain a received modulated data signal, multiplying the received modulated data signal by a decoder data modulation frequency to obtain upper and lower received sideband data signals, and selecting the upper received sideband data signal as a received modulated data signal. This further embodiment then calls for decoding the received envelope modulated data signal.

The foregoing and other features and advantages of the present invention will be more readily apparent from the following detailed description, which proceeds with references to the accompanying drawings.

BRIEF DESCRIPTION OF THE DRAWINGS

Preferred embodiments of the present invention are described with reference to the following drawings, wherein:

FIG. 2B is a waveform diagram representing a 4-PSK signal disposed along a time axis;

FIG. 7 is a block diagram illustrating a simplified 16-QAM modulator/demodulator system;

FIG. 11 is a block diagram illustrating an embodiment of a high density transmission system according to the present invention;

FIGS. 12A–D are spectrum diagrams illustrating the operation of the system of FIG. 11.

DETAILED DESCRIPTION OF PREFERRED EMBODIMENTS

The present invention is directed towards an apparatus and method for transmitting envelope encoded data signals over long distances with good error performance. Discussion of the present invention proceeds with some background regarding high density encoding of data and the resulting signals.

As mentioned above, a data signal can be sent by modulating the amplitude of an RF carrier using a base band data signal. This approach is called Amplitude Modulation (AM). AM is the simplest form of modulation because the base band signal directly modulates the amplitude of the RF carrier in order to impress the digital data signal onto the RF carrier. However, due to noise and non-linear performance in the RF channel, the error performance of digital amplitude modulation is relatively poor, particularly with regard to envelope detection, and the average signal to noise power ratio (SNR) is relatively low. The data density that can be obtained with pure digital AM is also relatively low.

Figure 1:
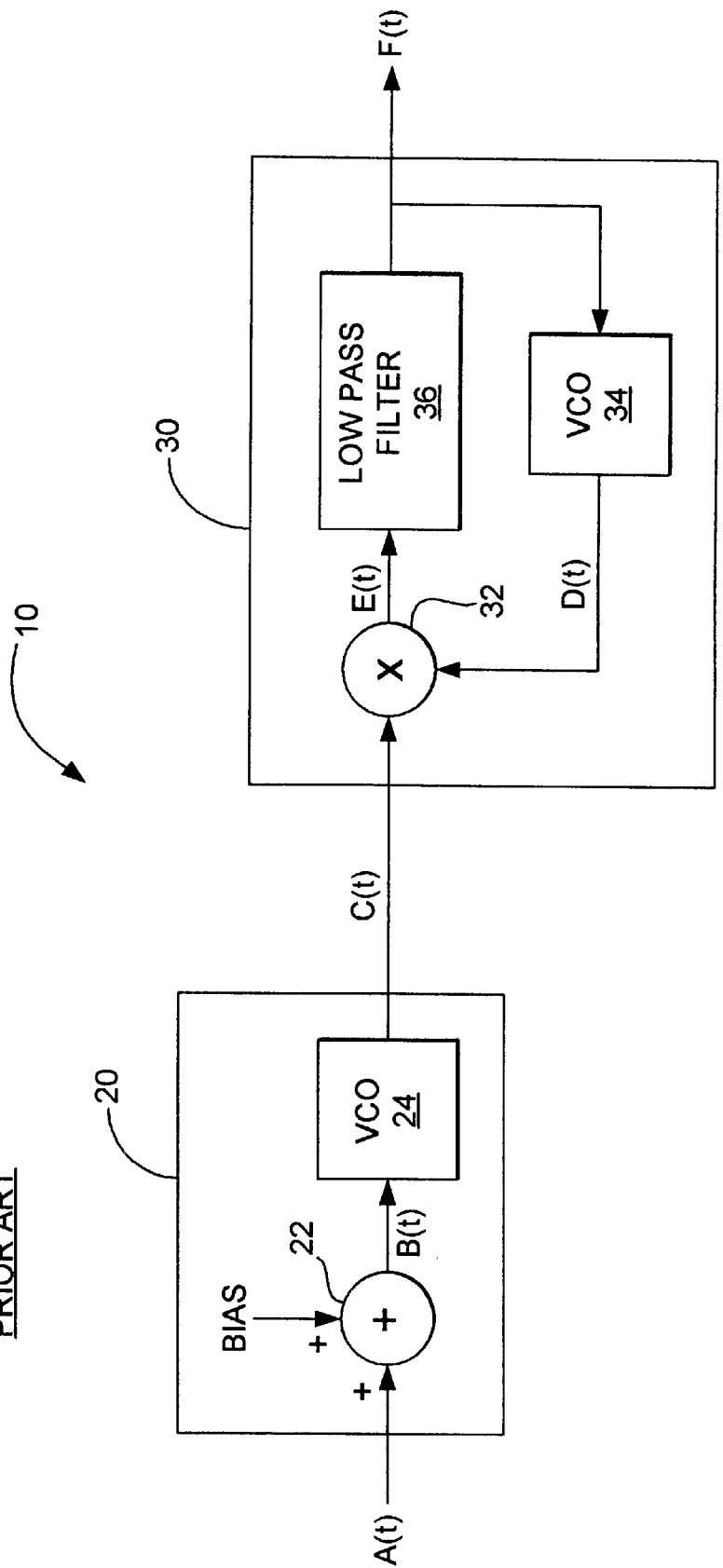
FIG. 1 is a block diagram illustrating a generalized FSK transmission system.

Frequency Shift Keying (FSK) is a higher density encoding scheme that has a constant envelope that can be used to directly modulate an RF carrier. In FSK, the frequency of the carrier frequency is varied slightly to encode the base band signal. A block diagram of a conventional FSK system is shown in FIG. 1 that illustrates a generalized FSK transmission system 10. In system 10, a transmitter 20 receives a baseband signal A(t) that is summed with a bias signal BIAS in summer 22 to generate signal B(t). Signal B(t) is the input drive signal to Voltage Controlled Oscillator (VCO) 24 which varies the frequency of its output signal C(t) responsive to the signal B(t) at its input.

The BIAS voltage is selected to center the oscillation of VCO 24 at a preselected RF carrier frequency for the RF channel. Consequently, output signal C(t) is frequency modulated signal centered on the preselected RF carrier frequency.

The resulting output signal C(t) generated by transmitter 20 is transmitted to receiver 30. Phase detector 32 of receiver 30 receives C(t) at one input and a feedback signal D(t) from VCO 34 at another input. Phase detector 32 subtracts D(t) from C(t) in order to produce a difference signal E(t) representing a difference in frequency between signals C(t) and D(t). The difference signal E(t) is input to low pass filter 36 that integrates the difference signal in order to produce an output data signal F(t) that corresponds to the baseband signal A(t) input to summer 22 of transmitter 20.

The output data signal F(t) is input to VCO 34 in order to generate feedback signal D(t) and form a phase-locked-loop (PLL). The phase detector 32 measures the difference in phase between the C(t), which is a modulated carrier frequency, and the output of VCO 34. A positive value is produced when the frequency of C(t) leads D(t) and a negative value is produced when C(t) lags D(t). The resulting signal E(t) is then filtered to minimize the effects of noise and is used to drive the VCO in a negative feedback loop that seeks to reduce the phase difference between C(t) and D(t).

FSK, as described above, has a constant carrier signal envelope and therefore can be used to directly modulate an RF signal for long distance transmission. However, FSK has relatively low data density and poor error performance when compared to Phase Shift Keying (PSK). Error performance is particularly poor when multilevel signaling is introduced in a confined bandwidth in order to improve the data density.

Figure 2B:
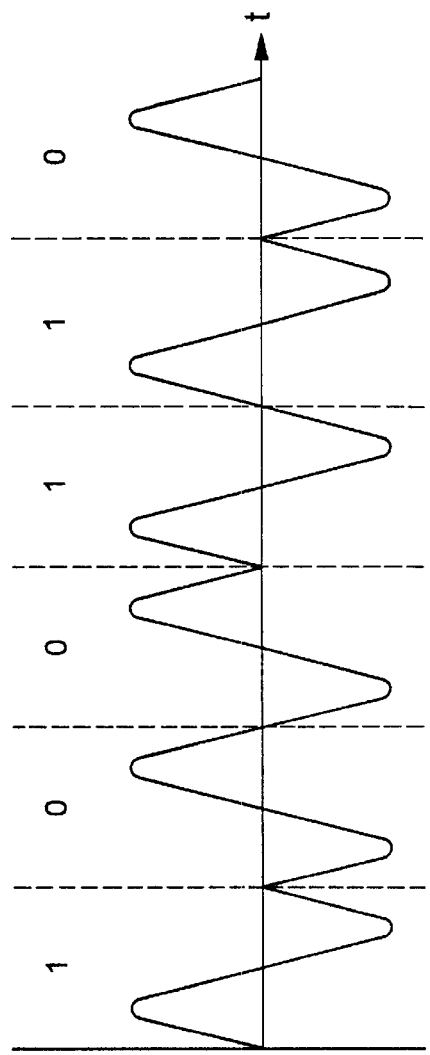
FIG. 2B is a waveform diagram representing a 2-PSK signal disposed along a time axis.
Figure 2D:
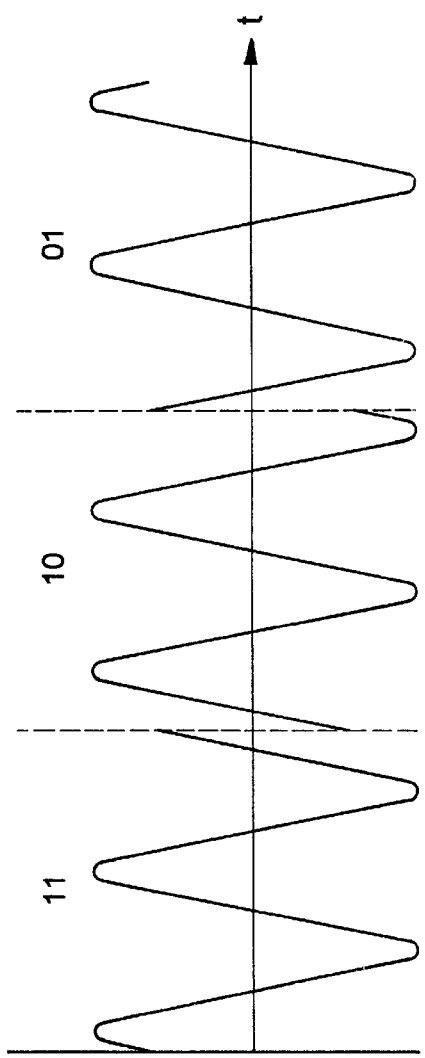
FIG. 2A is a phasor diagram representing 2-PSK signal encoding.
FIG. 2C is a phasor diagram representing 4-PSK signal encoding.
Figure 2A:
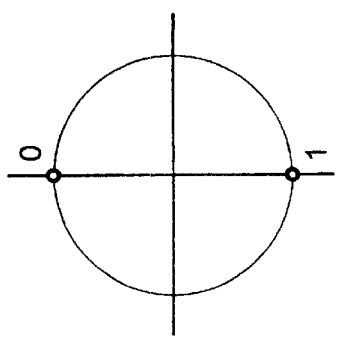

In PSK, the phase of the carrier signal is shifted responsive to the base band signal in order to encode the data. The resulting signal has high data density, an almost constant carrier signal envelope and good error performance. FIG. 2A is a phase diagram representing 2-PSK which has two phases that are 180° apart and represent logic values "0" and "1". FIG. 2B is a time waveform that illustrates a 2-PSK signal, disposed along a time axis, that encodes the stream of binary logic bits appearing above the waveform. Note how the waveform reverses phase when the digital bit stream transitions from a "0" to a "1" and vice-versa. For this reason, 2-PSK can also be referred to as Phase Reversal Keying (PRK).

Figure 2C:
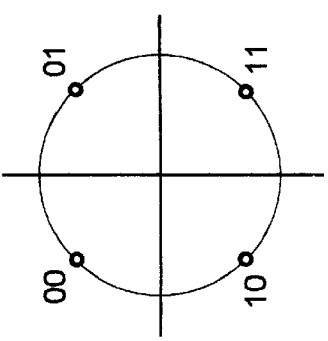

FIG. 2C is a phase diagram representing 4-PSK, which is also known as Quadrature PSK (QPSK), that uses four phases that are 90° apart in order to represent logic values "00", "01", "10" and "11". FIG. 2D is a time waveform that illustrates a 4-PSK signal, disposed along a time axis, that encodes the stream of binary logic bits appearing above the waveform. Note that the signaling rate in FIG. 2D is half that of signal 2B for comparison purposes. Each phase shift in 4-PSK represents two bits of data. For the same signaling rate, 4-PSK is able to obtain twice the data density of 2-PSK and even higher data rates can be obtained with other phase orientations, such as 8-PSK and 16-PSK.

A general expression for n-ary PSK is shown in equation (1) below:

$$x(t) = \cos[\omega_c t + (m_n(t) \cdot \Delta\phi)/2] \quad (1)$$

where $\Delta\phi = 2\pi/n$ is the separation between adjacent signal phases and $m_n(t)$ is a symmetric n-level NRZ baseband signal.

High density encoding can be obtained using PSK. However, the amplitude of the resulting PSK encoded signal will vary due to the instantaneous changes in phase used to encode the data. For instance, a phase shift from 90° to 0° will result in an amplitude change in the signal. Note the changes in amplitude of the waveform signal in FIG. 2D due to the phase changes that encode the binary bit pairs. As a result, high density PSK is not suitable for modulating an RF carrier signal for long distance transmission.

PSK signals can also be represented as a linear combination of a cosine wave and a sine wave having zero starting phases. This form of representation is called quadrature signal representation and is particularly useful for describing PSK signals. Quadrature representation can be derived from equation (2) below, which is a trigonometric identity:

$$\cos(\omega_c t + \phi) = \cos\phi \cdot \cos\omega_c t - \sin\phi \cdot \sin\omega_c t \quad (2)$$

The $\cos\phi$ and $\sin\phi$ are constants over a signaling interval and therefore represent coefficients for expressing $\cos(\omega_c t + \phi)$ as a linear combination of the signals $\cos\omega_c t$ and $\sin\omega_c t$. The signals $\cos\omega_c t$ and $\sin\omega_c t$ are referred to as being in quadrature because they are 90° out-of-phase relative to one another. The signals thus represent basis vectors in a two-dimensional phasor diagram where the cosine signal is typically referred to as the in-phase signal I and the sine signal referred to as the out-of-phase signal Q. Table 1 below represents an example of the quadrature signal representations for a 4-PSK signal.

TABLE 1

| Data Values | $\cos \omega_c t$ | $\sin \omega_c t$ | Composite Signal |
| --- | --- | --- | --- |
| 01 | 0.707 | −0.707 | $\cos(\omega_c t + \pi/4)$ |
| 00 | −0.707 | −0.707 | $\cos(\omega_c t + 3\pi/4)$ |
| 10 | −0.707 | 0.707 | $\cos(\omega_c t - 3\pi/4)$ |
| 11 | 0.707 | 0.707 | $\cos(\omega_c t - \pi/4)$ |

It is possible to use direct modulation by a baseband signal to generate a PSK signal by linearly combining the two quadrature signals of the quadrature representation described above. In order to implement this, two multilevel baseband signals are needed: one for the in-phase signal I and one for the out-of-phase signal Q. The baseband signals are referred to as $m_I(t)$ and $m_Q(t)$, respectively, and have voltage signal levels that correspond to the coefficients needed to represent the PSK signal, such as the coefficient values for 4-PSK illustrated in Table 1.

Figure 3:
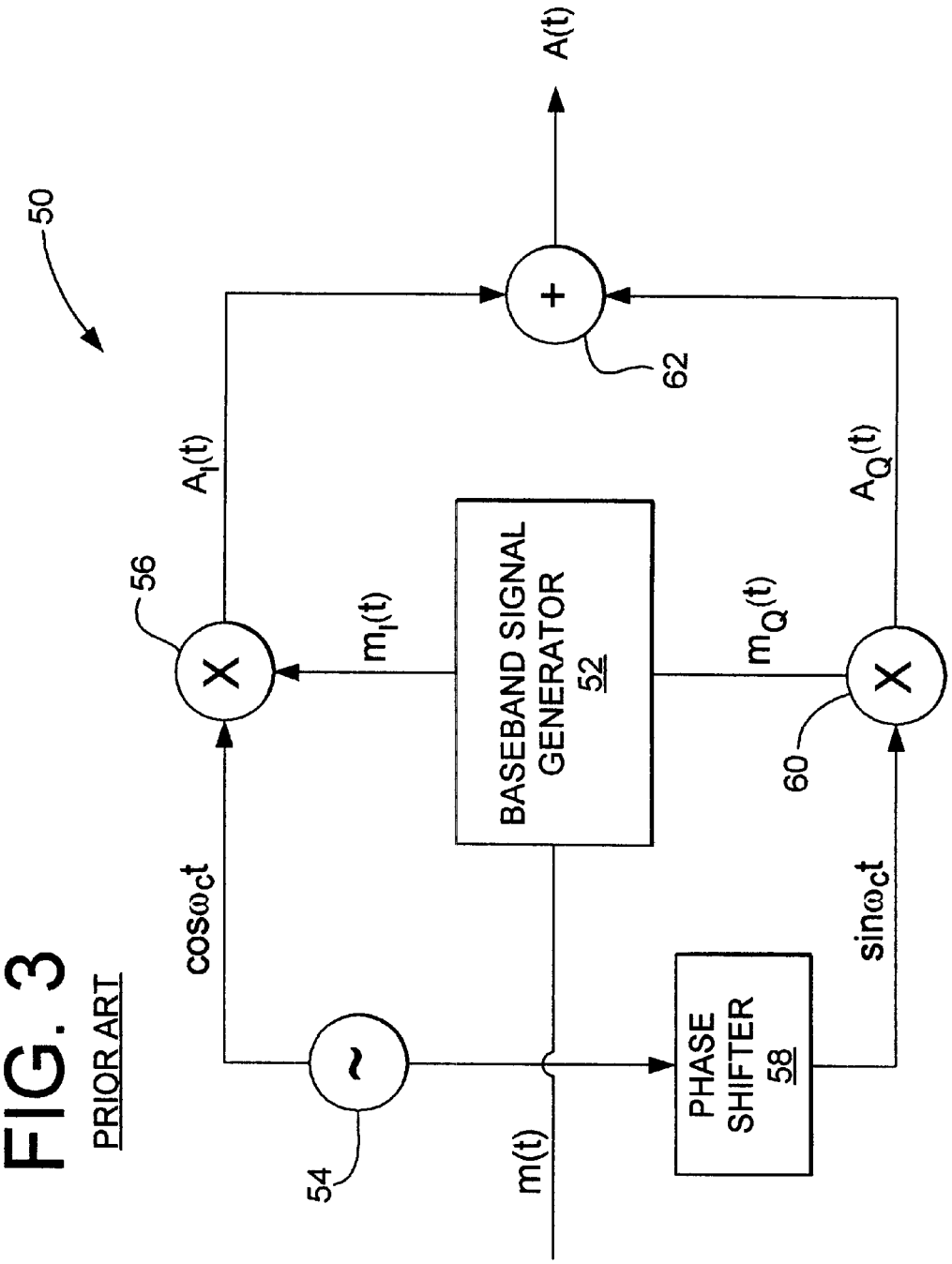
FIG. 3 is a block diagram illustrating a generalized example of a PSK transmitter that operates on the basis of quadrature representation.

FIG. 3 is a block diagram that illustrates a generalized example of a PSK transmitter 50 that operates on the basis of quadrature representation. A broadband data signal m(t) is input to a baseband signal generator 52 that splits the data signal m(t) into in-phase $m_I(t)$ and out-of-phase $m_Q(t)$ data signal components. An oscillator 54 generates a carrier frequency signal $\cos\omega_c t$ that is input to multiplier 56 along with the in-phase data signal $m_I(t)$ such that the two signals are multiplied to obtain an amplitude modulated in-phase signal $A_I(t)$. The carrier frequency signal $\cos\omega_c t$ is also input to a 90° phase shifter 58 that delays the $\cos\omega_c t$ signal in order to produce the out-of-phase carrier signal $\sin\omega_c t$. The out-of-phase carrier $\sin\omega_c t$ and out-of-phase data signal $m_Q(t)$ are input to multiplier 60 that multiplies the signals to obtain an amplitude modulated out-of-phase signal $A_Q(t)$. The in-phase $A_I(t)$ and out-of-phase $A_Q(t)$ signals are then summed by summer 62 to generate a constant envelope PSK signal A(t).

Figure 4:
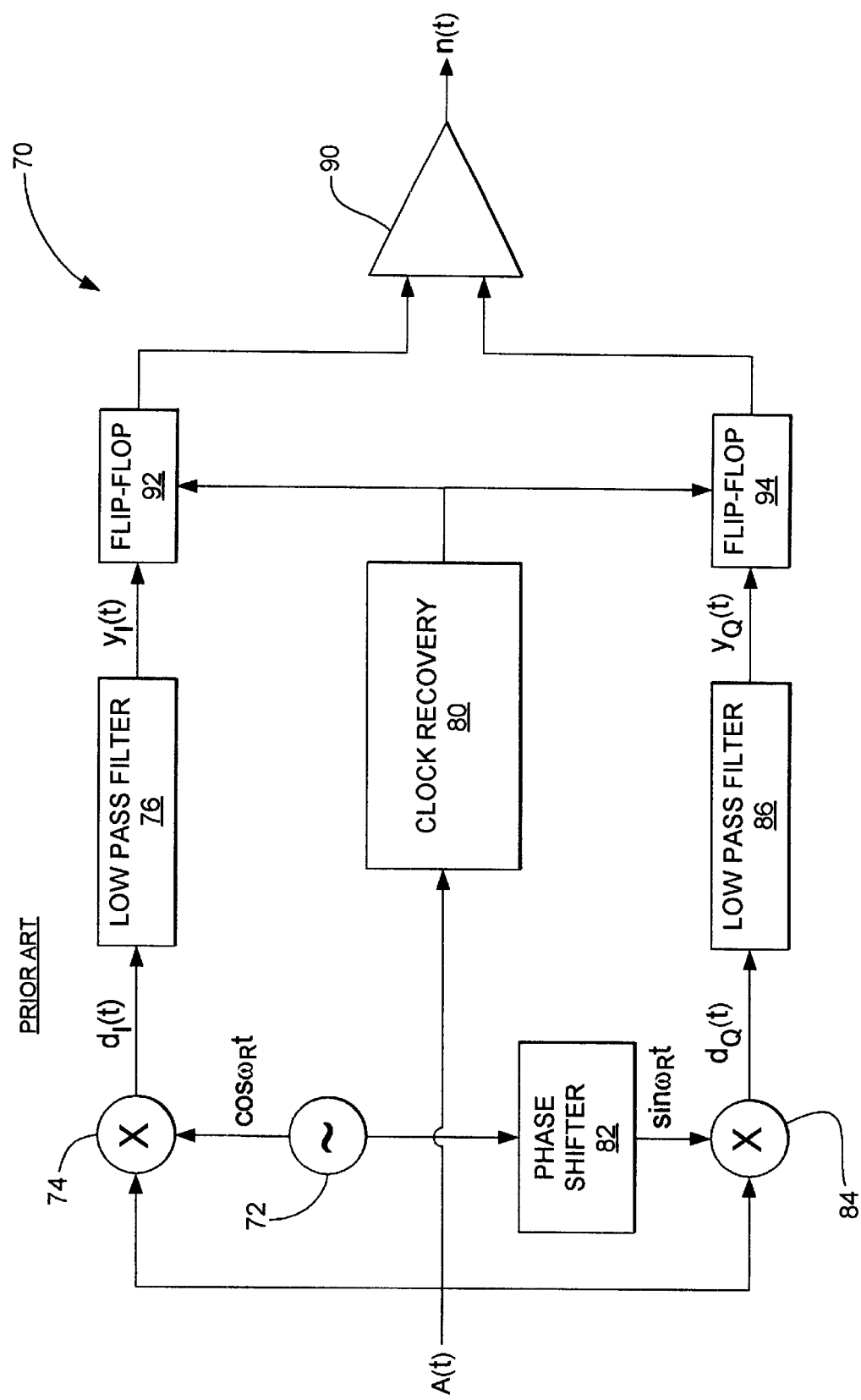
FIG. 4 is a block diagram illustrating generalized receiver for demodulating a PSK signal.

FIG. 4 is a block diagram that illustrates a generalized receiver 70 for demodulating the PSK signal A(t). Receiver 70 has a coherent reference frequency source 72 that generates the reference frequency signal $\cos\omega_R t$. The carrier frequency signal $\cos\omega_R t$ is input, along with the incoming signal A(t), to phase detector 74 in order to obtain an in-phase difference signal $d_I(t)$ that is proportional to the signal amplitude as well as to $\cos\omega_R t$. The difference signal $d_I(t)$ is then input to low pass filter 76 to remove twice carrier terms from $d_I(t)$ to obtain the I channel signal $y_I(t)$.

The carrier frequency signal $\cos\omega_R t$ output from frequency source 72 is also input to 90° phase shifter 82 in order to obtain the out-of-phase carrier signal $\sin\omega_R t$. The out-of-phase carrier signal $\sin\omega_R t$ is input, along with the incoming signal A(t), to phase detector 84 in order to obtain an out-of-phase difference signal $d_Q(t)$ that is proportional to the signal amplitude as well as to $\sin\omega_R t$. The difference signal $d_Q(t)$ is then input to low pass filter 86 to remove twice carrier terms from $d_Q(t)$ in order to obtain the Q channel signal $y_Q(t)$.

The incoming signal A(t) is also input to a clock recovery circuit 80 that extracts a sample clock signal $f_S$ that is used to sample the channel signals $y_I(t)$ and $y_Q(t)$ that are input to flip-flops 92 and 94, respectively. The flip-flops 92 and 94 capture the value of channel signals $y_I(t)$ and $y_Q(t)$ during each signal cycle. The outputs of flip-flops 92 and 94 are then combined in parallel to series converter 90 to obtain the received data signal n(t).

The approach just described, where two separate data signals are formed using carrier signals in quadrature with one another, is sometimes referred to as quadrature multiplexing. The I and Q channels in transmitter 50 and receiver 70 will not interfere with one another so long as coherence of the carrier references are maintained such that the carrier signals remain truly orthogonal. However, any misalignment between the carriers results in crosstalk between the channels. Also, demodulation and detection of higher-level PSK systems, such as 16-PSK or 64-PSK, can become complicated.

Figure 5:
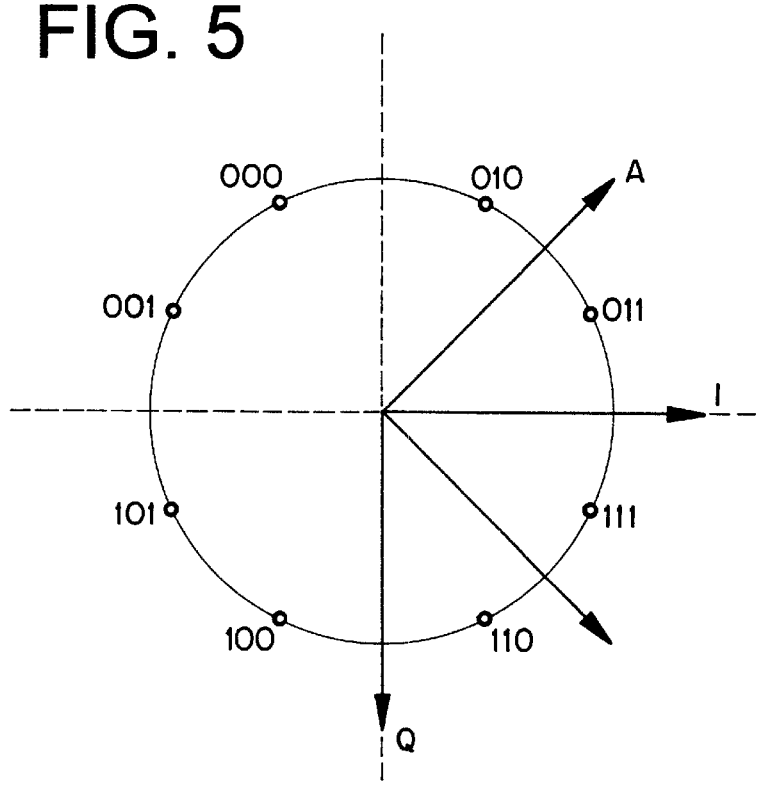
FIG. 5 is a phasor diagram illustrating 8-PSK encoding having I, Q, A and B phasors.

The PSK encoding performed by the transmitter 50 and receiver 70 can be represented in a phasor diagram, such as the phasor diagram for an 8-PSK signal shown in FIG. 5. The phasors of the I and Q channels can be viewed as rotating counter-clockwise around the circle containing the dots, where each dot corresponds to a symbol representing a three bit binary value. In order to obtain eight data symbols, additional phasors A and B are introduced and must be encoded and modulated at the transmitter end and demodulated and decoded at the receiver end. As the number of PSK encoding levels increases, the number of dots increases and the distance between symbols, i.e. the distance between the dots in FIG. 5, becomes progressively reduced. The reduced distance between symbols contributes to a higher probability of inter-symbol interference and the error performance of the system degrades. Inter-symbol interference can occur due to many common operating conditions, such as the introduction of noise and misalignment of the reference signals in the demodulator.

Figure 6A:
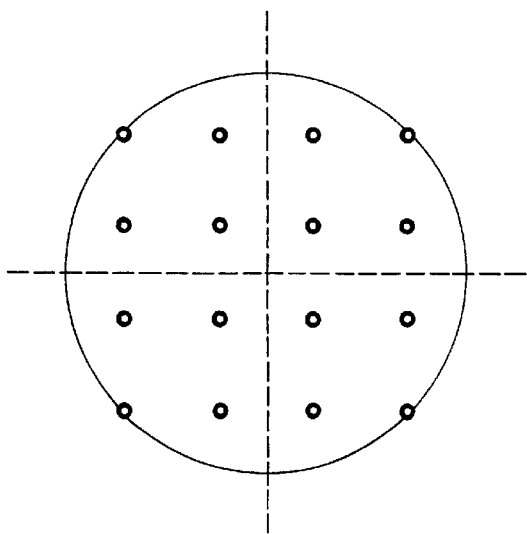
FIG. 6A is a constellation diagram for 16-QAM.
Figure 6B:
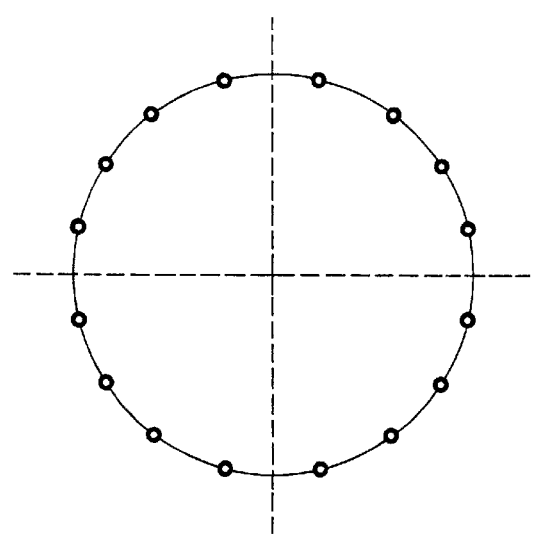
FIG. 6B is a constellation diagram for 16-PSK.

Another form of signal representation is Quadrature Amplitude Modulation (QAM), briefly mentioned above, which is an extension of multiphase PSK modulation having two baseband signals that are generated independently of each other. In QAM, each of the I and Q channels is amplitude modulated using a multilevel baseband data signal. As a result, the dots representing the symbols in QAM fall in a pattern, often called a constellation, that is markedly different from that of a PSK system. FIG. 6A illustrates a constellation pattern for a 16-QAM system alongside a constellation pattern for a 16-PSK system in FIG. 6B. As is apparent from the figures, the symbol dots in the 16-QAM constellation of FIG. 6A are spaced at greater intervals than those between the symbol dots in the 16-PSK constellation of FIG. 6B. The greater distance between symbols in the QAM system results in reduced inter-symbol interference and better error performance, particularly at higher data densities. Note, however, that data is encoded in the amplitude as well as phase and the resulting QAM encoded signal does not have a constant envelope.

A generalized 16-QAM modulator/demodulator system 100 is illustrated in FIG. 7. FIG. 7 is a functional block diagram illustrating the components of both a transmitter 110 and a receiver 130 in QAM system 100. FIGS. 8A–E are waveforms illustrating examples of baseband data signals for each of the I and Q channels and for a 16-QAM signal corresponding to the data signals.

Figure 8A:
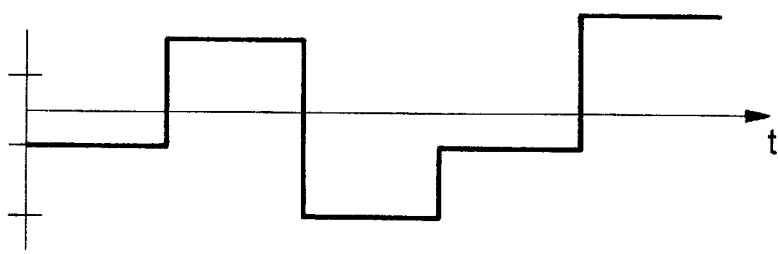
FIGS. 8A–E are waveform diagrams illustrating an example of the 16-QAM modulation and demodulation performed by the circuit of FIG. 7.
Figure 8B:
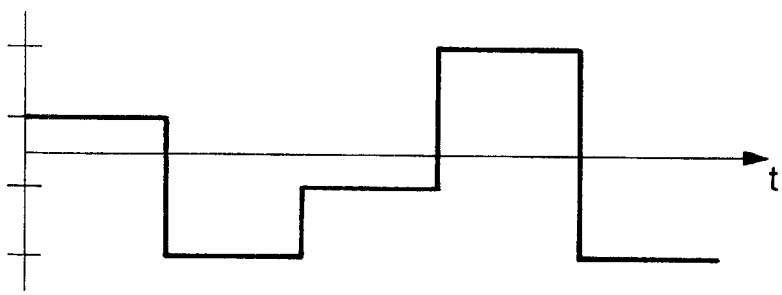

As discussed above with regard to FIG. 3, a data signal m(t) is divided into separate in-phase $m_I(t)$ and out-of-phase $m_Q(t)$ base band data signals. In FIG. 7, these baseband data signals have four different voltage levels corresponding to four binary logic values, as illustrated in the waveforms of FIGS. 8A and 8B. A frequency source 114 generates a carrier frequency signal cos $\omega_c t$ that is input to 90° phase shifter 116 to obtain the orthogonal carrier frequency signal sin $\omega_c t$. The carrier signal cos $\omega_c t$ is input to multiplier 112 along with baseband data signal $m_I(t)$ such that $m_I(t)$ amplitude modulates the carrier signal COS $\omega_c t$ in order to generate amplitude modulated data signal $A_I(t)$. Similarly, orthogonal carrier signal sin $\omega_c t$ is input to multiplier 118 along with baseband data signal $m_Q(t)$ such that $m_Q(t)$ amplitude modulates the carrier signal cos $\omega_c t$ in order to generate amplitude modulated data signal $A_Q(t)$. Amplitude modulated data signals $A_I(t)$ and $A_Q(t)$ are then summed by summer 120 to produce 16-QAM coded signal A(t). The QAM signal A(t) is then output to receiver 130.

Receiver 130 includes coherent reference source 136 that generates a coherent reference signal cos $\omega_R t$ that is input to 90° phase shifter 138 to obtain the orthogonal reference frequency signal sin $\omega_R t$. The reference signal cos $\omega_R t$ is input to phase detector 132 along with the 16-QAM signal A(t) to obtain a difference signal that is a recovered I channel data signal $M_I(t)$. The recovered I band data signal $M_I(t)$ is then filtered by low pass filter 134 to remove the twice carrier frequency terms present in the recovered signal. Similarly, orthogonal reference signal sin $\omega_R t$ is input to phase detector 140 along with the received QAM signal A(t) to obtain a difference signal that is a recovered Q channel data signal $M_Q(t)$. The recovered Q channel data signal $M_Q(t)$ is then filtered by low pass filter 142.

Figure 8C:
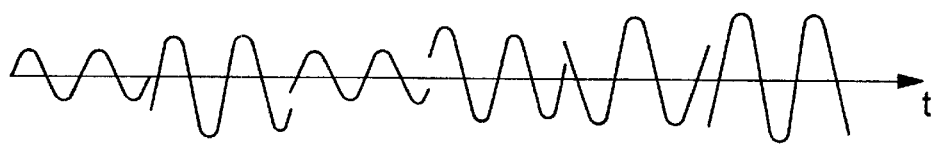
Figure 8D:
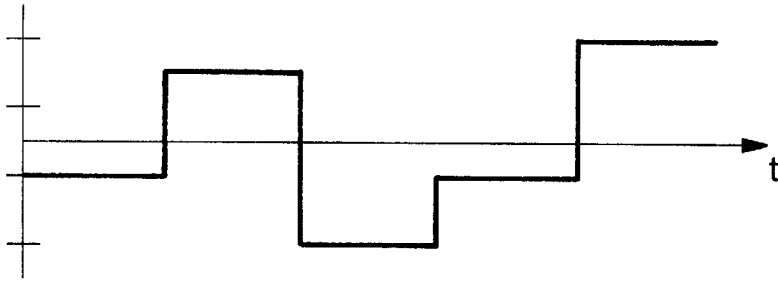
Figure 8E:
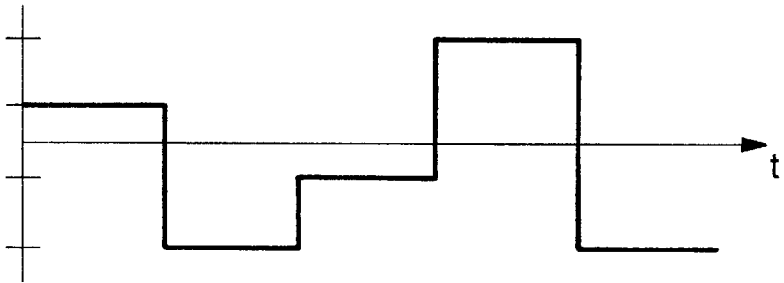

FIGS. 8A–E are waveform diagrams illustrating an example of the 16-QAM modulation and demodulation performed by the circuit of FIG. 7. FIGS. 8A and 8B are waveforms for an example of the baseband data signals $m_I(t)$ and $m_Q(t)$, respectively. The baseband data signals are multi-level signals that can each take on one of four voltage levels, each voltage level corresponding to a two-bit binary logic value. The voltage levels are indicated by the hatch marks on the voltage axis for the signal. The resulting 16-QAM signal A(t) corresponding to the baseband data signals in FIGS. 8A and 8B is shown in FIG. 8C. Note the phase and amplitude shifts between the signal cycles in A(t). The $M_I(t)$ and $M_Q(t)$ channel signals demodulated from the A(t) waveform of FIG. 8C are shown in FIGS. 8D and 8E, respectively.

Note that the 16-QAM signal A(t) in FIG. 8C is not a constant envelope signal. The amplitude of the signal is varied in order to encode information. As a result, anything which affects the envelope of the signal will introduce noise and degrade the error performance of the QAM based communication system. Consequently, QAM cannot be used in systems that use saturating amplifiers. High density QAM also requires extremely linear amplifier performance to accommodate a wide range of signal amplitudes.

As noted above, it is often desirable to transmit and receive high density digital data signals, such as PSK or QAM encoded signals or even a single sideband Pulse Amplitude Modulated (PAM) signal, over an RF system. However, due to the fact that information in a high density data signal is frequently encoded in the non-constant envelope of the signal, it is difficult to cost-effectively transmit the high density data signal with good error performance over a power and noise limited channel.

For reliable reception, a 256-QAM signal must be transmitted with an average power level of 15 dB less than the specified 1 dB compression point of the transmit amplifier in order to avoid third order intermodulation of the signal. This is commonly referred to as "back-off". Also, the SNR of the received signal must be greater than about 30 dB in order for the data to be reliably received. In a typical transmission and reception system with a transmit antenna gain of 16 dB, a receiver noise figure of 6 dB, a receive antenna gain of 30 dB and a rain fade of 3 dB per kilometer, a 6 MHz bandwidth 256-QAM signal can be reliably received at less than a kilometer distance.

Prior solutions to long distance transmission of high density data have been to lower the density of the QAM constellation (e.g. fewer dots in the constellation and fewer bits encoded) or to choose a different modulation technique, such as Offset Quadratic Phase Shift Keying (OQPSK), which has a nearly constant envelope, or Gaussian Minimum Shift Keying (GMSK), which has a constant envelope. OQPSK still requires some backoff of the transmitter power in order to avoid intermodulation spectral regrowth. GMSK has good average signal power to noise power ratio (SNR) performance, but is not a high density modulation because the data density is less than one bit per Hz of bandwidth.

In order to receive an RF signal at the greatest distance with the greatest integrity, it is desirable to have as great a SNR as possible at the receiving site. There are many methods of enhancing SNR at the receiver, such as improving the antenna gain, maximizing the peak-to-average ratio, lowering the noise power of the receiver, or by spectrum spreading.

Wideband Frequency Modulation (FM) on an RF channel is an approach that can maintain the maximum peak-to-average ratio of the RF signal because the carrier envelope of the modulation is constant. Another desirable property of wideband FM is SNR improvement through spectrum spreading. Briefly, wideband FM exhibits an improvement of the SNR of the modulating signal beyond the SNR of the carrier with respect to the transmission channel by using additional bandwidth. More specifically, if the maximum bandwidth of a baseband data signal A(t) used to frequency modulate an RF carrier is $f_A$ and is well less than a maximum deviation of the RF carrier frequency $f_D$, then the resulting SNR improvement obtained by wideband frequency modulating the data signal A(t) would be approximately $3*(f_D/f_A)^2$.

Figure 9:
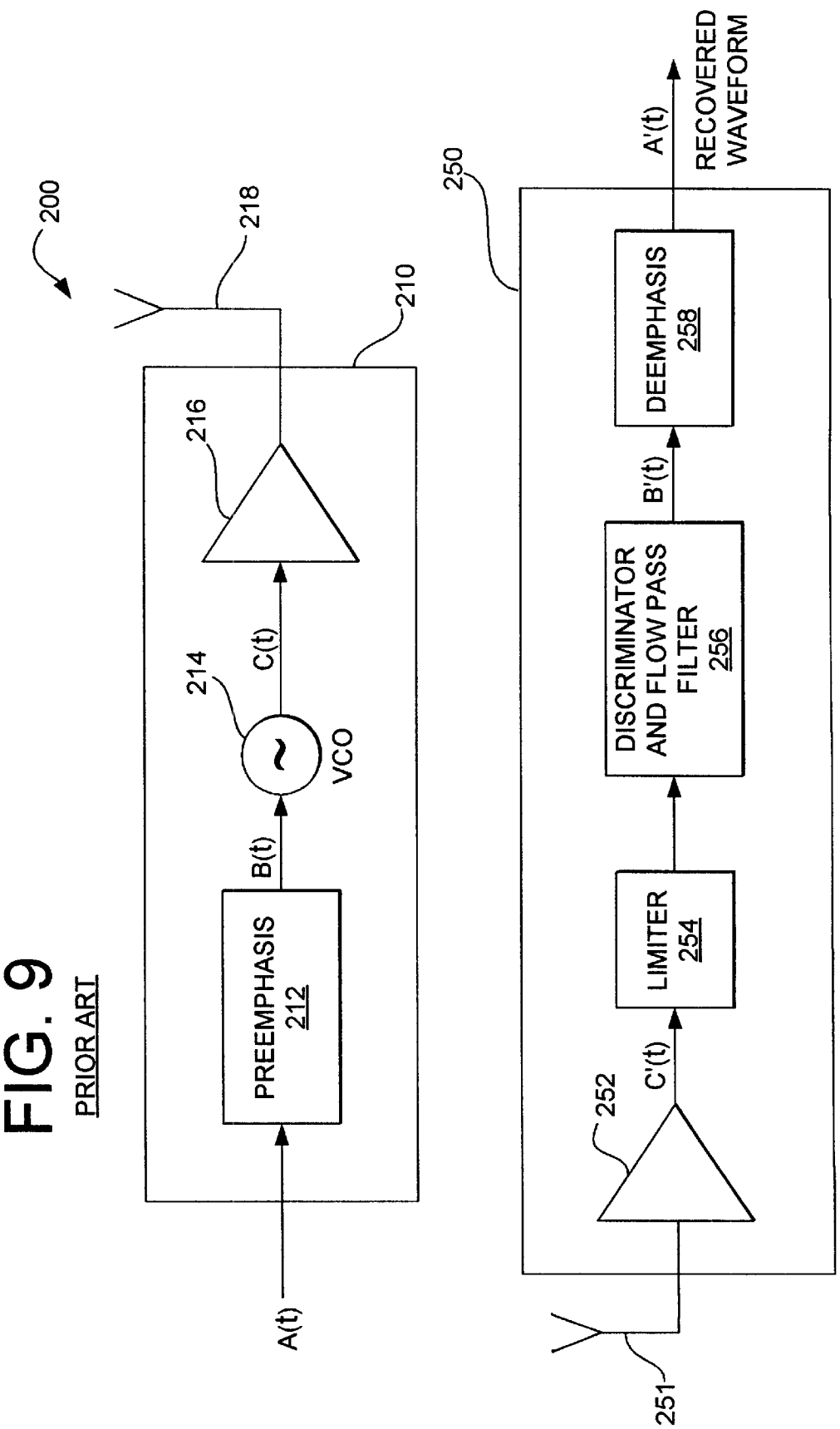
FIG. 9 is a block diagram illustrating a generalized FM radio system.

A block diagram of a generalized FM radio system 200 is shown in FIG. 9 of the drawings. A modulating waveform A(t) is input to an RF transmitter chain 210 that begins with a preemphasizer 212. In order to compensate for noise introduced in a discriminator 256 present in the receiver chain 250, the preemphasizer 212 increases the amplitude of the higher frequencies of the modulating waveform A(t) in order to produce emphasized modulating signal B(t). B(t) is input to VCO 214 which is biased to oscillate around a predetermined RF carrier frequency. VCO 214 frequency modulates the RF carrier frequency responsive to the voltage of emphasized modulating signal B(t) in order to generate a frequency modulated RF signal C(t) that is amplified by RF transmit amplifier 216 and transmitted from transmit antenna 218.

The FM RF signal C(t) broadcast from transmit antenna 218 is received by receive antenna 251 of the receive chain 250. An RF receive amplifier 252 amplifies a received RF signal C'(t), which is composed of transmitted RF signal C(t) plus distortion introduced by the RF channel, and outputs it to a limiter 254. In order to reduce noise and distortion introduced by the RF channel, the limiter 254 amplitude limits received signal C'(t).

The amplitude limited signal is then input to discriminator and low pass filter 256 which produces a recovered emphasized signal B'(t). An example of one type of discriminator suitable for use in a wideband FM system is a two-input exclusive-OR gate where the same signal is input to both input gates, but where one of the input gates includes a delay which slightly delays the signal. This type of discriminator is one of the simplest and works well for digital systems.

Figure 10:
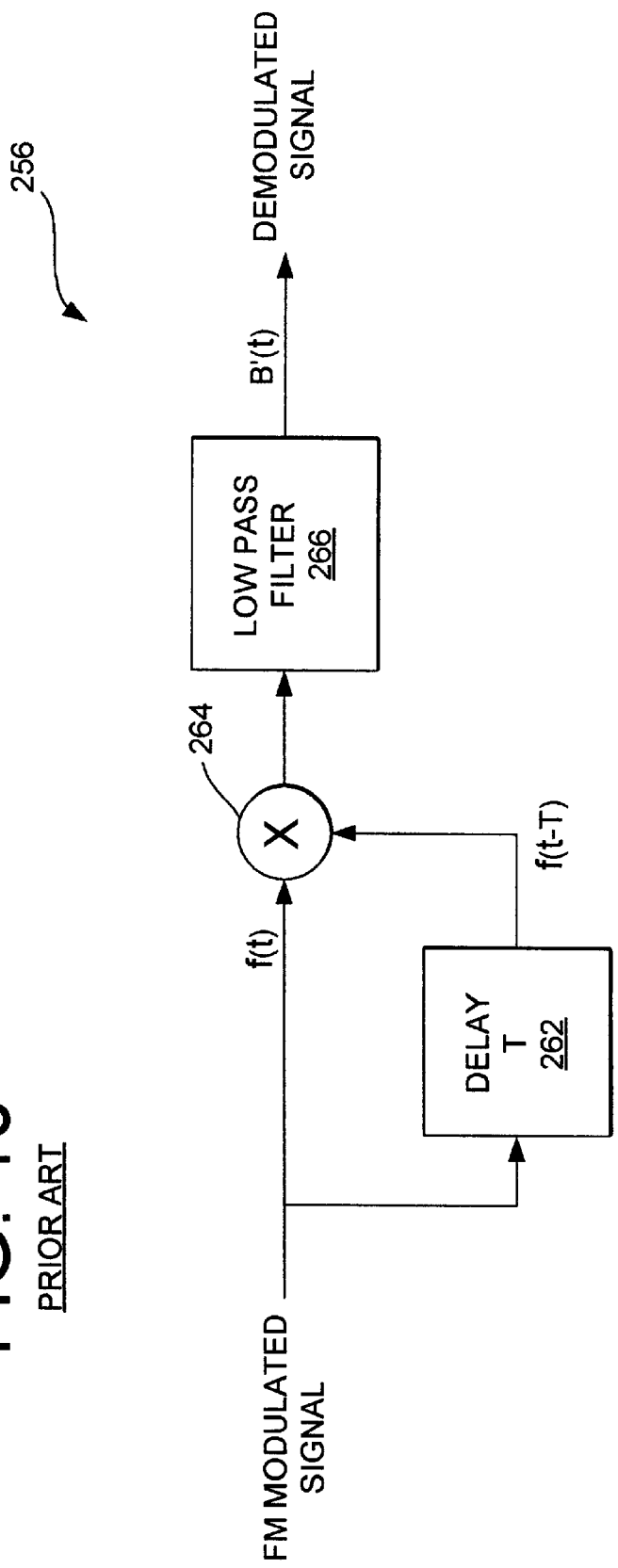
FIG. 10 is a block diagram illustrating one embodiment of the discriminator and low pass filter of FIG. 9.

Another type of discriminator 256 produces B'(t) by multiplying the amplitude limited frequency modulated signal from limiter 254 by a delayed version of itself. FIG. 10 illustrates one embodiment of such a discriminator. A frequency modulated signal ƒ'(t) input to the discriminator 256 is input to a delay element 262 that delays the signal ƒ'(t) in order to obtain a delayed version of the signal ƒ'(t−T). The signal ƒ'(t) is input to one input of multiplier 264 and the delayed signal ƒ'(t−T) is input to another input of the multiplier. The multiplier 264 then outputs ƒ'(t)*ƒ'(t−T) that is input to low pass filter 266 to obtain the demodulated signal B'(t).

The function of the discriminator 256 can be described mathematically as follows. The frequency modulating transmitter 210 of FIG. 9 produces the signal ƒ(t) responsive to A(t), where ƒ(t) is of the form $$f(t) = \cos\left(\omega_c t + \int_0^t A(t)\,dt\right).$$

A discrimination equation can be obtained using a delayed version of ƒ(t) that is ƒ(t−T) where:

$$f(t)*f(t-T) = \cos\left(\omega_c t + \int_0^t A(t)\,dt\right)*\cos\left(\omega_c(t-T) + \int_0^{t-T} A(t)\,dt\right)$$

Using the trigonometric identity cosA*cosB=½cos(A−B)+½cos(A+B), the discrimination equation above becomes:

$$f(t)*f(t-T) = \frac{1}{2}\cos\left(2\omega_c t - \omega_c T + \int_0^t A(t)\,dt + \int_0^{t-T} A(t)\,dt\right) + \frac{1}{2}\cos\left(\omega_c T + \int_{t-T}^t A(t)\,dt\right)$$

This equation can, in turn, be low pass filtered to remove the $2\omega_c t$ frequency term to obtain:

$$f(t)*f(t-T) \cong \frac{1}{2}\cos\left(\omega_c T + \int_{t-T}^t A(t)\,dt\right)$$

$$f(t)*f(t-T) = \frac{1}{2}\cos\omega_c T\cos\left(\int_{t-T}^t A(t)\,dt\right) - \frac{1}{2}\sin\omega_c T\sin\left(\int_{t-T}^t A(t)\,dt\right)$$

Choosing $T=\pi/2\omega_c$ causes cos $\omega_c T=0$ and sin $\omega_c T=1$. Thus, the equation above reduces to:

$$f(t)*f(t-T) = -\frac{1}{2}\sin\left(\int_{t-T}^t A(t)\,dt\right)$$

Then, using the approximation that sin(x)=x for small angles, yields:

$$f(t)*f(t-T) \cong -\frac{1}{2}\left(\int_{t-T}^t A(t)\,dt\right)$$

Then, using the Reimann approximation for small T yields:

ƒ(t)*ƒ(t−T)=−½(A(t))

which is essentially the original A(t) signal multiplied by a constant.

In short, a discriminator can be used to demodulate the received data signal without the need to recover an accurate reference signal from the received data signal. Discriminators and FM receivers are well understood in the art and one of ordinary skill in the art will understand that a variety of circuits, such as a Foster-Seeley discriminator or a phase-locked-loop composed of a voltage controlled oscillator, phase detector and integrator, can also be utilized in a FM receiver.

Returning to FIG. 9, B'(t) is then input to deemphasizer 258, which lowers the amplitude of the higher frequencies of B'(t) in a complementary manner to the emphasis introduced by preemphasizer 212, and a recovered modulating waveform A'(t) is obtained.

The present invention involves FM remodulation of an envelope modulated data signal, e.g. a high density data signal, in order to obtain long distance transmission of the data signal with good error performance. A block diagram of an embodiment of a high density transmission system 300, according to the present invention, is shown in FIG. 11 of the drawings. The system 300 includes a transmitter 310 having a high density encoding modulator 322 that receives a data signal m(t) and encodes it using a envelope modulating encoding scheme, such as QAM, to produce an envelope modulated data signal s(t) having a center frequency of modulation at $F_c$.

The resulting envelope modulated data signal s(t) is input to multiplier 324 where it is multiplied by a mixing frequency $F_{mix}$. Multiplier 324 outputs both the upper and lower sideband signals of $F_{mix}$ with respect to $F_c$. These sidebands are ($F_{mix}+F_c$) and ($F_{mix}-F_c$), respectively, and are the upper and lower transmit sideband data signals.

The sideband signals ($F_{mix}+F_c$) and ($F_{mix}-F_c$) are input to low pass filter 328 which removes the upper sideband ($F_{mix}+F_c$) and passes the lower sideband ($F_{mix}-F_c$). The lower sideband ($F_{mix}-F_c$) thus becomes the transmit data modulating waveform A(t) that is input to FM modulator 210, as described above with respect to FIG. 9, which imposes the modulating waveform A(t) onto an FM carrier signal for transmission over antenna 218.

The high density transmission system 300, according to the present invention, also includes a receiver 350 that receives the FM carrier signal transmitted by transmitter 310. Receiver 350 includes an FM receiver 250, as described above with respect to FIG. 9, which recovers the FM carrier signal using antenna 251 and recovers received modulated data signal A'(t).

Received modulated data signal A'(t), which contains the lower sideband ($F_c-F_{mix}$) transmitted by transmitter 310 plus some distortion introduced by the RF channel, is input to multiplier 362 along with a decoder data modulation frequency $F_{mod}$. Multiplier 362 will produce upper and lower sidebands of ($F_c-F_{mix}$) with respect to $F_{mod}$, i.e. $F_{mod}+(F_c-F_{mix})$ and $F_{mod}-(F_c-F_{mix})$, which are upper and lower received sideband data signals. The upper and lower received sideband signals are input to bandpass filter 364 which removes the lower sideband data signal $F_{mod}-(F_c-F_{mix})$ and passes the upper sideband data signal $F_{mod}+(F_c-F_{mix})$, which is a received envelope modulated data signal. The upper received sideband data signal $F_{mod}+(F_c-F_{mix})$ is then input to a high density demodulator 368, i.e. an envelope modulated data decoder, which converts the envelope modulated data signal back to a digital data stream.

The operation of the system 300 of FIG. 11 will now be discussed in greater detail with respect to the spectrum diagrams shown in FIGS. 12A–D. As mentioned above, high density encoder 322 produces an envelope modulated data signal having a frequency deviation bandwidth about center frequency $F_c$ that encodes the data signal m(t). For example, encoder 322 may be a 256-QAM encoder, which is an encoder commonly used in cable modem systems, that produces a high density envelope modulated data signal with a 44 MHz center frequency and a 6 MHz bandwidth. This signal is envelope modulated with some frequency spread components. It is not a wideband FM signal and it has poor SNR characteristics when transmitted directly. Therefore, it requires a very large SNR in the propagation medium to be transmitted directly. This signal is also too high in frequency to efficiently serve as a modulating signal for an RF carrier.

It is preferable that the transmit data modulating signal A(t) be a signal with a low center frequency that still retains the information encoded in the envelope modulated data signal. The high frequency of the envelope modulated data signal can be translated to a lower intermediate frequency (IF) so that it is suitable for use as a transmit data modulating signal for an FM system. To translate the envelope modulated data signal into an IF signal, it is mixed with mixing frequency $F_{mix}$ in multiplier 324 to obtain the spectrum shown in FIG. 12A. As noted above, the multiplier 324 outputs both upper and lower sidebands and low pass filter 328 removes the upper sideband to obtain the spectrum illustrated in FIG. 12B. $F_{mix}$ is selected such that the lower sideband data signal ($F_c-F_{mix}$) is shifted to within about one half of the bandwidth of the envelope modulated data signal. A rough equation for $F_{mix}$ is therefore:

$$F_{mix}=F_c-\tfrac{1}{2}*(\text{bandwidth of envelope modulated data signal}).$$

Thus, applying this approximate formula to the 44 MHz 256-QAM example above yields $F_{mix}$=44 MHz–½*(6 MHz)=41 MHz. Typically, a small guardband is also added to $F_{mix}$ in order to avoid introducing DC terms to the modulating signal A(t). Using a 1 MHz guardband yields $F_{mix}$=40 MHz.

The resulting lower sideband data signal ($F_c-F_{mix}$) for the example above is centered at 4 MHz and deviates +/−3 MHz. This signal has a low center frequency yet retains the data information encoded in the frequency deviation bandwidth modulation of the original envelope modulated data signal. The lower sideband data signal is then used as the transmit data modulating signal A(t) that drives FM modulator 210.

At the receiver 350 of high density transmission system 300, FM receiver 250 captures and demodulates the signal broadcast by transmitter 310 to obtain recovered modulated waveform A'(t). As illustrated in FIG. 12C, A'(t) is essentially the lower sideband data signal ($F_c-F_{mix}$) used as the transmit data modulating signal A(t) in transmitter 310 plus distortion introduced by the transmit and receive channel.

At this point, the received modulated data modulating signal A'(t) must be shifted to a frequency suitable for the high density demodulator 368 in order to recover a data signal. A'(t) is therefore input to the multiplier 362 along with decoder data modulation frequency $F_{mod}$. $F_{mod}$ is determined by the requirements of high density demodulator 368. Proceeding further on the example above, if demodulator 368 expects a 44 MHz center frequency to the data signal, then $F_{mod}$ is 40 MHz. However, other frequencies can be used to meet the requirements of other decoder devices.

As noted above, multiplier 362 will produce two sidebands $F_{mod}+/-(F_c-F_{mix})$ with respect to $F_{mod}$, the upper and lower received data sideband data signals. The upper and lower sideband data signals are input to bandpass filter 364 that is designed to pass a frequency band centered on $F_{mod}$ as required by demodulator 368. The upper sideband data signal is thus selected as a received envelope modulated data signal and passed to demodulator 368 for decoding.

To obtain an improved SNR from transmission system 300 of FIG. 11, the β of the RF transmission system must be greater than one. β is the ratio of the peak frequency deviation swing of the RF carrier versus the bandwidth of the modulating signal A(t). For example, if the carrier swing is 20 MHz and the bandwidth of modulating signal A(t) is 6 MHz, then the β is 3.33. The SNR increase is approximately $3*\beta^2$, which yields a carrier to noise power ratio increase of 33.3. If β is less than one, then there is insufficient deviation in the RF carrier to encode the modulating signal with improved SNR.

Performance will improve as β increases and the carrier to noise power ratio increase is preferably 18 dB. For example, if the maximum frequency of the transmit data modulating signal A(t) is 7 MHz, then the carrier frequency should swing to a peak frequency of 44 MHz, i.e. +/−22 MHz. It should be noted that there is a threshold of approximately 12 dB in order to obtain the FM noise improvement described here. Noise performance can actually be worsened if the carrier to noise ratio is below 12 dB. Thus, a wideband FM system having β much greater than unity (i.e. 1) is preferred in the present invention.

It is also important to note that a sideband will appear in the power spectrum of the RF carrier at about the maximum frequency of the modulating frequency A(t). In the example above, the maximum frequency of A(t) is 7 MHz (e.g. 4 MHz center frequency plus 3 MHz upward swing) and additional sidebands will appear at +/−7 MHz relative to the FM deviation of the RF carrier. Therefore, some additional bandwidth is required to accommodate this sideband in the RF channel.

Figure 13:
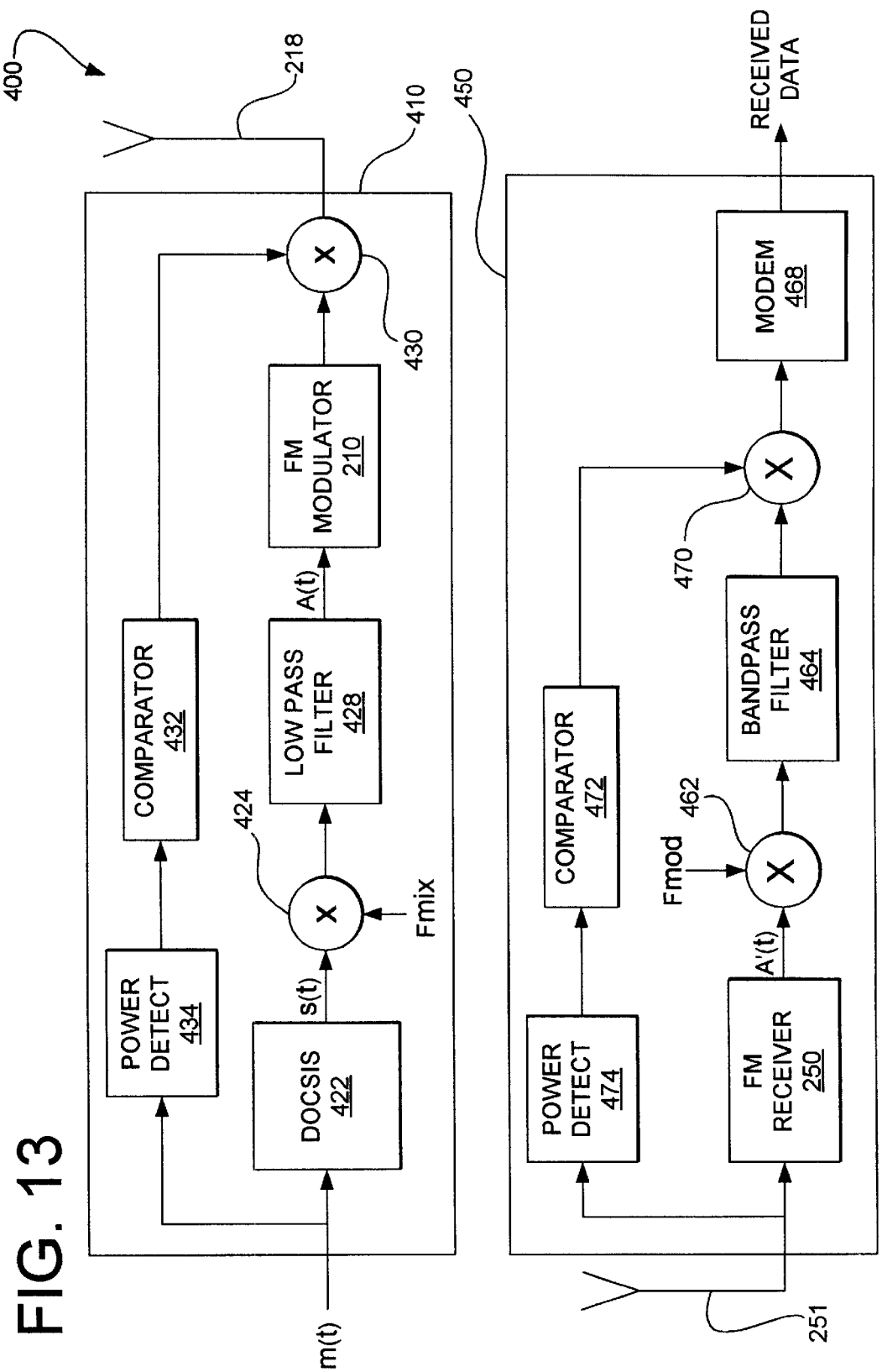
FIG. 13 is a block diagram illustrating an embodiment of a high density transmission system, according to the present invention, that features Time Division Multiplexing.

FIG. 13 illustrates another embodiment of a high density transmission system 400, according to the present invention, configured to turn the RF carrier signal on when an envelope modulated data signal s(t) is present and off when the envelope data signal s(t) is not active. The transmit chain 410 of system 400 utilizes a Data Over Cable Services Interface Specification (DOCSIS) compliant Cable Modem 422 that generates time division multiplexed (TDM) QAM data signal as an envelope modulated data signal s(t) responsive to a stream of binary transmit data m(t). Cable modem 422 only generates the QAM signal s(t) when transmit data m(t) is present.

Similar to system 300 of FIG. 11, the envelope modulated data signal s(t) is mixed with mixing frequency $F_{mix}$ in mixer 424 to obtain upper and lower transmit sideband data signals that are passed through lowpass filter 428 in order to obtain transmit data modulating frequency A(t) for FM modulator 210. However, in transmit chain 410, the modulated RF signal output by FM modulator 210 is then input to an RF switch 430 before being output to transmit antenna 218.

RF switch 430 is controlled by an output of a threshold comparator 432 that receives an output of a power detector 434. Power detector 434 monitors the envelope modulated data signal s(t) and generates an output signal whose magnitude is proportional to the power level of s(t). Threshold comparator 432 compares the output of power detector 434 to a threshold value in order to produce an output signal that switches RF switch 430 on when s(t) is active and off when s(t) is idle. Thus, the RF signal output by FM modulator 210 is gated on and off in sequence with the envelope of the QAM signal s(t) from the cable modem so that multiple devices can transmit on the same RF channel. Note that this approach can be applied to any TDM device and not only the cable modem shown in this embodiment.

The receive chain 450 of system 400 includes FM receiver 250 which receives the RF signal transmitted by the transmitter chain 410 via antenna 251. Similar to the receive chain 350 of FIG. 11, FM receiver 250 recovers received modulated data signal A'(t) from the RF signal for input to multiplier 462 along with data modulating signal $F_{mod}$. Multiplier 462 multiplies the received modulated data signal A'(t) by $F_{mod}$ to produce upper and lower received sideband data signals. Bandpass filter 464 removes the lower sideband data signal and passes the upper sideband data signal which is a QAM data signal suitable for decoding by cable modem headend 468.

In receive chain 450, however, another RF switch 470 is inserted between the bandpass filter 464 and cable modem headend 468. RF switch 470 is controlled by threshold comparator 472 and power detector 474. Power detector 474 monitors the power level of the received RF data signal received on antenna 251 and outputs a signal whose magnitude is proportional to that power level. Threshold comparator 472 compares the output of the power detector to another threshold value in order to gate the upper sideband data signal input to the cable modem headend 468 through RF switch 470. In this manner, the system 400 preserves the TDM characteristics of the original QAM signal generated by the cable modem 422 throughout the FM remodulation process.

It should be understood that the method, system and apparatus described herein are not related or limited to any particular type of computer apparatus (hardware or software), unless indicated otherwise. Various types of general purpose or specialized computer apparatus may be used with or perform operations in accordance with the teachings described herein.

In view of the wide variety of embodiments to which the principles of the invention can be applied, it should be understood that the illustrated embodiments are exemplary only, and should not be taken as limiting the scope of the present invention. For example, more or fewer elements or components may be used in the block diagrams. In addition, different aspects of the present invention can be practiced with software, hardware, or a combination thereof.

The claims should not be read as limited to the described order or elements unless stated to that effect. Therefore, all embodiments that come within the scope and spirit of the following claims and equivalents thereto are claimed as the invention.

We claim:

1. A data transmission system, the system comprising:

an envelope modulating data encoder having input and output terminals, where the encoder is configured to receive a binary data stream at the input terminal and, responsive thereto, generate an envelope modulated data signal at the output terminal;

a mixer having first and second input terminals and an output terminal, the first input terminal being coupled to the output terminal of the envelope modulating data encoder, the second input terminal being configured to receive a mixing frequency, and where the mixer is configured to mix the envelope modulated data signal and the mixing frequency in order to generate upper and lower sideband transmit data signals at the output terminal of the mixer;

a lowpass filter having input and output terminals, the input terminal being coupled to the output terminal of the mixer, where the lowpass filter is configured to pass the lower sideband transmit data signal generated by the mixer to the output terminal of the lowpass filter; and a frequency modulator having input and output terminals, the input terminal being coupled to the output terminal of the lowpass filter, where the frequency modulator is configured to frequency modulate a radio frequency carrier responsive to the lower sideband transmit data signal received from the lowpass filter in order to generate a frequency modulated data signal.

2. The data transmission system of claim 1, where the mixing frequency is selected to be an intermediate frequency that preserves a frequency deviation bandwidth of the envelope modulated data signal.

3. The data transmission system of claim 1, where the mixing frequency is selected to be approximately a center frequency of the envelope modulated data signal less one half of a frequency deviation bandwidth of the envelope modulated data signal.

4. The data transmission system of claim 1, where the envelope modulating data encoder further comprises a quadrature amplitude modulation (QAM) encoder.

5. The data transmission system of claim 1, where the frequency modulator further comprises a wideband frequency modulator having a carrier frequency deviation that is greater to than a frequency deviation bandwidth of the envelope modulated data signal.

6. The data transmission system of claim 1, the system further including:
a power detector having input and output terminals, the input terminal of the power detector being coupled to the output of the envelope modulating data encoder, where the power detector is configured to generate an output signal at the output terminal of the power detector having a magnitude that is proportional to a power level of the envelope modulated data signal;
a comparator having input and output terminals, the input terminal of the comparator being coupled to the output terminal of the power detector, where the comparator is configured to compare the output signal from the power detector to a preselected threshold in order to generate a control signal for output at the output terminal of the comparator; and
a RF switch having input, output and control terminals, the input terminal being coupled to the output terminal of the frequency modulator and the control terminal being coupled to the output terminal of the comparator such that the RF switch is configured to gate the frequency modulated data signal output by the frequency modulator responsive to the control signal generated by the comparator.

7. The data transmission system of claim 1, the system further comprising:
a frequency modulation receiver having input and output terminals, the input terminal being configured to receive the frequency modulated data signal and the frequency modulation receiver being configured to demodulate the radio frequency modulated data signal in order to recover a received modulated data signal for output at output terminal of the frequency modulation receiver;
a multiplier having first and second input terminals and an output terminal, the first input terminal of the multiplier being coupled to the output terminal of the frequency modulation receiver and the second input terminal of the multiplier being configured to receive a decoder data modulation frequency, where the multiplier is configured to multiply the data modulation frequency and the received modulated data signal in order to generate upper and lower received sideband data signals at the output terminal of the multiplier;
a bandpass filter having input and output terminals, the input terminal of the bandpass filter being coupled to the output terminal of the multiplier, where the bandpass filter is configured to pass the upper received sideband data signal to the output terminal of the bandpass filter; and
an envelope modulated data decoder having input and output terminals, the input terminal of the decoder being coupled to the output terminal of the bandpass filter, where the decoder is configured to demodulate data centered on the decoder data modulation frequency input to the multiplier such that the decoder demodulates the upper receiver sideband data signal in order to obtain a received binary data stream for output at the output terminal of the decoder.

8. The data transmission system of claim 7, the system further including:
a first power detector having input and output terminals, the input terminal of the first power detector being coupled to the output of the envelope modulating data encoder, where the first power detector is configured to generate an output signal at the output terminal of the first power detector having a magnitude that is proportional to a power level of the envelope modulated data signal;
a first comparator having input and output terminals, the input terminal of the first comparator being coupled to the output terminal of the first power detector, where the first comparator is configured to compare the output signal from the first power detector to a preselected threshold in order to generate a control signal for output at the output terminal of the first comparator; and
a first RF switch having input, output and control terminals, the input terminal being coupled to the output terminal of the frequency modulator and the control terminal being coupled to the output terminal of the first comparator such that the first RF switch is configured to gate the frequency modulated data signal output by the frequency modulator responsive to the control signal generated by the first comparator.

9. The data transmission system of claim 8, the system further including:
a second power detector having input and output terminals, the input terminal of the second power detector being coupled to the input terminal of the frequency modulation receiver, where the second power detector is configured to generate an output signal at the output terminal of the second power detector having a magnitude that is proportional to a power level of the frequency modulated data signal;
a second comparator having input and output terminals, the input terminal of the second comparator being coupled to the output terminal of the second power detector, where the second comparator is configured to compare the output signal from the second power detector to another preselected threshold in order to generate another control signal for output at the output terminal to of the second comparator; and
a second RF switch having input, output and control terminals, the input terminal being coupled to the output terminal of the bandpass filter, the control terminal being coupled to the output terminal of the second comparator and the output terminal of the second RF switch being coupled to the input terminal of the envelope modulated data decoder such that the second RF switch is interposed the bandpass filter and the envelope modulated data decoder, where the second RF switch is configured to gate the upper receiver sideband data signal input to the envelope modulated data decoder responsive to the another control signal generated by the second comparator.

10. A data receiver system, the system comprising:

a frequency modulation receiver having input and output terminals, the input terminal being configured to receive a frequency modulated data signal modulated by an envelope modulated data signal, the frequency modulation receiver being configured to demodulate the frequency modulated data signal in order to recover the envelope modulated data signal for output at the output terminal of the frequency modulation receiver;

a multiplier having first and second input terminals and an output terminal, the first input terminal being coupled to the output terminal of the frequency modulation receiver and the second input terminal being configured to receive a decoder data modulation frequency, where the multiplier is configured to multiply the decoder data modulation frequency and the envelope modulated data signal in order to generate upper and lower receiver sideband data signals at the output terminal of the multiplier;

a bandpass filter having input and output terminals, the input terminal of the bandpass filter being coupled to the output terminal of the multiplier, where the bandpass filter is configured to pass the upper receiver sideband data signal to the output terminal of the bandpass filter; and an envelope modulated data decoder having input and output terminals, the input terminal of the decoder being coupled to the output terminal of the bandpass filter, where the decoder is configured to demodulate data centered on the decoder data modulation frequency input to the multiplier such that the decoder demodulates the upper receiver sideband data signal in order to obtain a binary data stream corresponding to the envelope modulated data signal for output at the output terminal of the decoder.

11. The data receiver system of claim 10, the system further including:

a power detector having input and output terminals, the input terminal of the power detector being coupled to the input terminal of the frequency modulation receiver, where the power detector is configured to generate an output signal at the output terminal of the power detector having a magnitude that is proportional to a power level of the frequency modulated data signal;

a comparator having input and output terminals, the input terminal of the comparator being coupled to the output terminal of the power detector, where the comparator is configured to compare the output signal from the power detector to a preselected threshold in order to generate a control signal for output at the output terminal of the comparator; and a RF switch having input, output and control terminals, the input terminal being coupled to the output terminal of the bandpass filter, the control terminal being coupled to the output terminal of the comparator and the output terminal of the RF switch being coupled to the input terminal of the envelope modulated data decoder such that the RF switch is interposed the bandpass filter and the envelope modulated data decoder, where the second RF switch is configured to gate the upper receiver sideband data signal input to the envelope modulated data decoder responsive to the control signal generated by the comparator.

12. A method for transmitting an envelope modulated data signal, the method comprising the steps of:

mixing the envelope modulated data signal with a mixing frequency to produce upper and lower sideband transmit data signals;

selecting the lower sideband transmit data signal as a transmit data modulating frequency; and modulating an RF carrier signal with the transmit data modulating frequency in order to generate a RF data signal.

13. The method of claim 12, including the step of selecting the mixing frequency such that the lower sideband transmit data signal is an intermediate frequency signal that preserves a frequency deviation bandwidth of the envelope modulated data signal.

14. The method of claim 12, including the step of selecting the mixing frequency to be approximately a center frequency of the envelope modulated data signal less one half of a frequency deviation bandwidth of the envelope modulated data signal.

15. The method of claim 12, where the envelope modulated data signal further comprises one of a quadrature amplitude modulation (QAM) signal, a phase shift keying (PSK) signal, and a single sideband amplitude modulated signal.

16. The method of claim 12, wherein the step of modulating an RF carrier signal further comprises wideband frequency modulating the RF carrier such that a carrier frequency deviation of the RF data signal is greater than a frequency deviation bandwidth of the envelope modulated data signal.

17. The method of claim 12, wherein the step of selecting the lower sideband transmit data signal as a transmit data modulating frequency further comprises low pass filtering the upper and lower sideband transmit data signals to remove the upper sideband transmit data signal.

18. The method of claim 12, further including the step of time division multiplexing the RF data signal.

19. The method of claim 18, wherein the step of time division multiplexing the RF data signal further comprises:

monitoring a power level of the envelope modulated data signal;

comparing the power level to a predetermined threshold; and gating the RF data signal on when the power level reaches the predetermine threshold and gating the RF data signal off when the power level is below the predetermined threshold.

20. The method of claim 12, the method further including the steps of:

receiving and demodulating the frequency modulated data signal to obtain a received modulated data signal;

multiplying the received modulated data signal by a decoder data modulation frequency to obtain upper and lower received sideband data signals;

selecting the upper received sideband data signal as a received modulated data signal; and decoding the received envelope modulated data signal.

21. The method of claim 20, where the step of selecting the upper received sideband data signal as a received modulated data signal further comprises bandpass filtering the upper and lower received sideband signals in order to remove the lower received sideband data signal.

22. The method of claim 20, further including the step of time division multiplexing the RF data signal.

23. The method of claim 22, wherein the step of time division multiplexing the RF data signal further comprises:

monitoring a power level of the envelope modulated data signal;

comparing the power level to a predetermined threshold;

gating the RF data signal on when the power level reaches the predetermine threshold and gating the RF data signal off when the power level is below the predetermined threshold.

24. The method of claim 23, further including the step of time division multiplexing the received modulated data signal.

25. The method of claim 24, wherein the step of time division multiplexing the received modulated data signal further comprises:

monitoring a power level of the RF data signal;

comparing the power level of the RF data signal to another predetermined threshold;

gating the received modulated data signal on when the power level of the RF data signal reaches the predetermine threshold and gating the received modulated data signal off when the power level of the RF data signal is below the predetermined threshold.

* * * * *